(12) United States Patent
Schreiber et al.

(10) Patent No.: US 10,150,139 B2
(45) Date of Patent: Dec. 11, 2018

(54) METHOD FOR OPERATING AN INLINE COATING SYSTEM AND INLINE COATING SYSTEM

(71) Applicant: Bühler Alzenau GmbH, Alzenau (DE)

(72) Inventors: Udo Schreiber, Jossgrund (DE); Ingo Wegener, Alzenau (DE); Jutta Trube, Mömbris (DE)

(73) Assignee: Bühler Alzenau GmbH, Alzenau (DE)

( * ) Notice: Subject to any disclaimer, the term of this patent is extended or adjusted under 35 U.S.C. 154(b) by 0 days.

(21) Appl. No.: 15/550,689

(22) PCT Filed: Feb. 15, 2016

(86) PCT No.: PCT/EP2016/053187
§ 371 (c)(1),
(2) Date: Aug. 11, 2017

(87) PCT Pub. No.: WO2016/128581
PCT Pub. Date: Aug. 18, 2016

(65) Prior Publication Data
US 2018/0036768 A1   Feb. 8, 2018

(30) Foreign Application Priority Data

Feb. 13, 2015 (DE) .................. 10 2015 001 706

(51) Int. Cl.
*C23C 16/54* (2006.01)
*B05D 3/04* (2006.01)
*C23C 14/56* (2006.01)

(52) U.S. Cl.
CPC .......... *B05D 3/0493* (2013.01); *C23C 14/566* (2013.01); *C23C 16/54* (2013.01)

(58) Field of Classification Search
CPC ............................ C23C 16/455; C23C 16/54
See application file for complete search history.

(56) References Cited

U.S. PATENT DOCUMENTS

2008/0223294 A1* 9/2008 Gebele ................. C03C 17/002
118/429
2009/0142165 A1* 6/2009 Krause ................. C23C 14/566
414/217

(Continued)

FOREIGN PATENT DOCUMENTS

EP        1571234 B1    6/2008
JP        S61501603 A   7/1986
(Continued)

OTHER PUBLICATIONS

Munzer, Adrian, et al., "Inline coating of silicon nanoparticles in a plasma reactor: Reactor design, simulation and experiment". Materials Today: Proceedings 4 (2017) S118-S127.*

(Continued)

*Primary Examiner* — Bret P Chen
(74) *Attorney, Agent, or Firm* — NK Patent Law

(57) ABSTRACT

An inline coating system has an introduction chamber comprising an introduction gate, a first buffer chamber which connects to the introduction chamber and which can be separated from the introduction chamber by means of a first sluice gate and other components. The first buffer chamber has a gap sluice device with at least one slit diaphragm, and when the first insertion gate is opened or closed, a pressure gradient within the first buffer chamber is adjusted between the pressure in the region of the second insertion gate and the pressure in the region of the first insertion gate.

9 Claims, 2 Drawing Sheets

(56) References Cited

U.S. PATENT DOCUMENTS

2010/0239762 A1    9/2010   Schulze et al.
2014/0208565 A1*   7/2014   Lotz ..................... C23C 14/562
                                                                                                                     29/428

FOREIGN PATENT DOCUMENTS

| JP | 2005232584 A | | 9/2005 | |
|---|---|---|---|---|
| NL | 8300443 A | | 9/1984 | |
| WO | WO8403195 A1 | | 8/1984 | |
| WO | WO 85/04071 | * | 9/1985 | ............ H05K 13/02 |
| WO | WO8504071 A1 | | 9/1985 | |
| WO | WO2009000813 A1 | | 12/2008 | |
| WO | WO2009004048 A1 | | 1/2009 | |

OTHER PUBLICATIONS

Somerville, Kristina, et al., "A Flow Reactor with Inline Analytics: Design and Implementation". Organic Process Research & Development, 2014, 18, 1315-1320.*
ISA/EP, International Search Report and Written Opinion for PCT Patent Application No. PCT/EP2016/053187, dated May 2, 2016.
WIPO, International Preliminary Report on Patentability for PCT Patent Application No. PCT/EP2016/053187, dated Aug. 15, 2017.
DPMA, Office Action for German Patent Application No. 10 2015 001 7063, dated Sep. 9, 2015.
JPO, Japanese Office Action for Japanese Patent Application No. 2017-542407, dated Jul. 2, 2018.

* cited by examiner

METHOD FOR OPERATING AN INLINE COATING SYSTEM AND INLINE COATING SYSTEM

CROSS REFERENCE TO RELATED APPLICATION(S)

This application is a 371 National Phase application of PCT Application No. PCT/EP2016/053187 filed on Feb. 15, 2016, which claims priority of German Patent Application No. 10 2015 001 706.3 filed on Feb. 13, 2015.

BACKGROUND

The invention relates to a method and system of inline coating with the features disclosed herein.

DESCRIPTION OF RELATED ART

Inline coating systems are known, for example, for coating planar substrates, such as, for example, glass substrates, plastic or metal substrates, substrates for displays, and wafers. A so-called 3-chamber vacuum coating machine includes a feed chamber for introducing the substrates into a process chamber, a discharge chamber for discharging the substrates from the process chamber, and a transport device for moving the substrates along a transport path. Instead of a single process chamber, multiple process chambers can also be used. On the input side and/or output side, one or more process chambers can also have transfer regions.

The known systems are designed and dimensioned for processing substrates of a distinct size. Plants with correspondingly larger chambers usually have to be used for processing substrates which differ from this particular size (over-length).

It is known from EP 1 571 234 B1 how to operate a system consisting of 2n+1 chambers, where n is an integer greater than or equal to 2, in such a way that substrates can be processed with overlap. In a 5-chamber system, a buffer chamber adjoins a feed chamber, to which a process chamber is connected which is adjoined by a further buffer chamber, to which a discharge chamber adjoins. Gates are provided between the chambers, which can be opened or closed. The inlet chamber, the buffer chamber and the out chamber are designed as similar modules for the reception of substrates up to a predetermined maximum size. For the coating of substrates, which are longer than the modules, the gate is opened between the infeed chamber and the buffer chamber and the gate is opened between the buffer chamber and the discharge chamber In this case, the pressure ratios of the buffer chambers and of the inlet and outlet chamber are matched to one another, whereby the pump programs for the introduction chamber and the first buffer chamber or the second buffer chamber and the discharge chamber are pumped from atmospheric pressure to, for example, 0.05 mbar. The known method makes it possible to process substrates with longer lengths, but the injection time and thus the entire cycle time of the system is prolonged disadvantageously.

WO 2009/000813 also discloses a sluice of a substrate into and out of a 3-chamber vacuum coating installation in which a sluice system is formed by a sluice chamber and a transfer chamber adjacent to the sluice chamber. A transfer chamber adjoins the transfer chamber, a process chamber vacuum sealing a closing gate valve. During transfer, the transfer chamber is connected to the sluice chamber and a sluice gate is opened between the transfer chamber and the sluice chamber, as long as the substrate is located in the sluice chamber. A coating system of this type is suitable for the flexible coating of substrates whose length is the length of a substrate lock chamber. At the end adjoining the lock chamber, the transfer chamber has a passage whose cross-section represents a narrowing of the chamber cross-section in the transport direction. Furthermore, the transfer chamber has a discharge opening in which a further sluice valve is arranged in comparison to the known three-chamber system so that the process chamber is to be vacuum-separated from the transfer chamber and the process vacuum can also maintained in the process chamber at atmospheric pressure in the transfer chamber. During the operation of the plant, the gate is opened and the substrate is transported into the sluice system. After the shut-off valve is closed, the pressure in the connected volume is lowered to a fine vacuum pressure. For the purpose of effecting the operation of the vacuum coating system, or the export opening, a pressure gradient is maintained in the connected volume, to reduce the pressure compensation between the transfer chamber and the lock chamber.

It is an object of the present invention to provide a method for operating an inline coating installation for carrying out the method which would make it possible to reduce the time needed for the introduction and the total cycle time of the plant.

The object is achieved with the features of the independent patent claims. Advantageous embodiments and further developments of the invention is summarized in the dependent claims.

The method according to the invention relates to the operation of an inline coating installation comprising a feed chamber with an insertion gate and a first buffer chamber, which is connected to the introduction chamber, and can be separated from the introduction chamber by means of a first sluice gate. A second sluice gate can be separated from the buffer chamber, and a second sluice port connected to the process chamber. A second buffer chamber can be separated from the process chamber by means of a third sluice gate. A discharge chamber adjoins the second buffer chamber with an outlet port, by means of a fourth sluice gate and buffer chamber. The introducing chamber, the buffer chamber, another buffer chamber, and the discharge chamber are designed as a module for the reception of substrates up to a predetermined size.

As known in the art, the substrates are transported from the infeed chamber through the first buffer chamber to the process chamber and from the process chamber through the second buffer chamber to the discharge chamber.

The method is provided for that the first buffer chamber has a slot sluice device with at least one slit diaphragm which creates a pressure gradient between the pressure in the region of the second sluice gate and the pressure in the region of the first sluice gate which is set within the first buffer chamber. When the first sluice gate is open, the pressure gradient between the pressure in the region of the second sluice gate and the pressure in the region of the first sluice gate can be adjusted. Likewise, when the first sluice gate is closed, the pressure gradient between the pressure in the region of the second sluice gate and the pressure in the region of the first sluice gate can be adjusted.

The method according to the invention is characterized in that a pressure gradient between the pressure in the region of the second sluice gate and the pressure in the region of the first sluice gate is maintained even when the insertion gate and the first sluice gate are open by operating pumps connected to the sluice chamber within the buffer chamber, whereby the injection time can be further reduced.

Preferably, the first buffer chamber is continuously evacuated, preferably with exception of aeration phase of the lock chamber.

The slit gate includes at least a slit diaphragm, preferably a plurality of slit diaphragms which are connected in series in the longitudinal direction of the chamber. The gap sluice device allows a pressure decoupling between the sluice chamber and the process chamber as well as the creation of a pressure gradient within the buffer chamber. In the case of a plurality of slit diaphragms, an increasing course of the pressure gradient is advantageously realized in the longitudinal direction of the chamber according to the positions of the slit diaphragms. Advantageously, the chamber volume is reduced, particularly advantageously minimized, by the gap sluicing device.

The gap sluicing device makes it possible, together with the pressure gradient, to decouple the sluice chamber and the process chamber in a more pressure-sensitive manner than is known, for example, from EP 1 571 234 B1 and WO 2009/000813, and thus it is possible to reduce the introduction time, i.e. the time for transporting a substrate from the entry of the substrate into the sluice chamber up to the entrance into the process chamber.

BRIEF SUMMARY

Advantageously, when coating substrates with a length less than the length of the modules, a pressure trigger point for the pressure in the sluice chamber, to which the second sluice gate is opened, can be set higher than in the case of operation without a pressure gradient and thus the introduction time, and quantity of air pumped out of the sluice chamber can also be reduced. In the prior art, without using a pressure gradient, for example, evacuation of the inlet chamber up to a pressure of about 15 mbar and evacuation of the buffer chamber to 10-2 mbar is customary. In the case of the method according to the invention, the injection chamber, with the same chamber as in the prior art, needs only to be evacuated to a pressure of, for example, about 36 mbar, without the pumping gum or the pumping stations being altered, in contrast to the prior art. This can be done according to the invention, for example, with a 15% lower feed-in time than in the prior art.

A further embodiment of the method is characterized in that the first sluice gate is closed for the coating of substrates, which are smaller than the modules, the insertion gate is opened, a substrate is transported into the insertion chamber, the insertion gate is closed, the insertion chamber is evacuated to a predetermined pressure, the first sluice gate is opened, the substrate is conveyed into the buffer chamber, wherein a lower pressure is set in the buffer chamber in the area of the second sluice gate than in the sluice chamber, the first sluice gate is closed again, the buffer chamber is evacuated to a pressure which approximately corresponds to the pressure of the process chamber and the second sluice gate is opened, the substrate is transported into the process chamber and the second sluice gate is closed and the substrate is processed in the process chamber.

A further embodiment of the method is distinguished by the fact that for the coating of substrates which are larger than the modules, the insertion gate and the first sluice gate are opened, a substrate is transported into the sluice chamber and the buffer chamber, the insertion gate is closed, the sluice chamber is evacuated to a predetermined pressure, the sluice chamber is evacuated to a predetermined pressure in the region of the second sluice gate which approximately corresponds to the pressure of the process chamber and the second sluice gate is opened and the substrate is transported into the process chamber in order to be processed there. In contrast to the state of the art known from EP 1 571 234 B1, the pressure ratios of the buffer chamber and the introduction chamber are not adapted to one another for the coating of overlapping substrates, whereby the cycle time can be reduced.

A further embodiment of the method is characterized in that the first sluice gate is closed after the substrate has passed the first sluice gate with its rear edge and the trailing edge has not passed the second sluice gate so that the evacuation of the first buffer chamber is more efficient.

A further embodiment of the method is characterized in that the second sluice gate is closed after the substrate has passed the second sluice gate with its rear edge, so that the evacuation of the process chamber can be more efficient.

A further embodiment of the method is characterized in that the first sluice gate is opened after the substrate has passed with its rear edge the second sluice gate, so that a further substrate can be transported faster into the first buffer chamber.

A further embodiment of the method is characterized in that, even when the insertion gate and the first sluice gate are open, by operating pumps connected to the sluice chamber within the buffer chamber in the region of the second sluice chamber, a pressure of less than 500 mbar, preferably less than 600 mbar, is maintained at atmospheric pressure in the lock chamber. The process vacuum in the process chamber can be maintained with higher safety and protected against contamination.

A further embodiment of the method is characterized in that within the buffer chamber a pressure gradient is established between the pressure in the region of the second and the pressure in the region of the first sluice gate, in which the pressure in the region of the second sluice gate is at least a factor of 2 times less than the pressure in the area of the first sluice gate, with which process vacuum in the process chamber is maintained with higher safety and can be protected against contamination. Preferably, a far higher factor than 2, for example 10 or 200, can be provided at the end of the pumping-off cycle.

In accordance with the above-described procedure, it is also possible to introduce substrates during the discharge of substrates.

An inline coating installation according to the invention includes a feed chamber with an insertion gate and a first buffer chamber, which is connected to the introduction chamber, which can be separated from the introduction chamber by means of a first sluice gate. The inline coating installation further includes a process chamber adjoining the first buffer chamber, which is connected by means of a second sluice gate which can be separated from the buffer chamber, a second buffer chamber, which is connected to the process chamber and can be separated from the process chamber by means of a third sluice gate, a discharge chamber adjoining the second buffer chamber with an outlet port which can be separated from the second buffer chamber by means of a fourth sluice gate, wherein the feed chamber, the buffer chamber and the discharge chamber are designed as a module for the reception of substrates up to a predefined size, wherein the substrates for the coating are transported from the feed chamber through the first buffer chamber to the process chamber and from the process chamber through the second buffer chamber to the discharge chamber. The apparatus is distinguished by the fact that the first buffer chamber has a gap sluice device with at least one gap slit, by means of which, with the first sluice gate open, a pressure gradient can be set between the pressure in the region of the second sluice port and the pressure in the region of the first sluice gate. Likewise, when the first sluice gate is closed, a pressure gradient between the pressure in the region of the second sluice gate and the pressure in the region of the first sluice gate can be achieved by a sluice gate.

The system and method according to the invention has the corresponding advantages.

The dimensions of the corresponding chambers for discharging can also be selected appropriately during discharge and are encompassed by the invention.

BRIEF DESCRIPTION OF THE DRAWINGS

The invention is described in more detail below with reference to exemplary embodiments of the figures, from which also further aspects and advantages of the invention result.

It shows.

DETAILED DESCRIPTION

Figure 1:
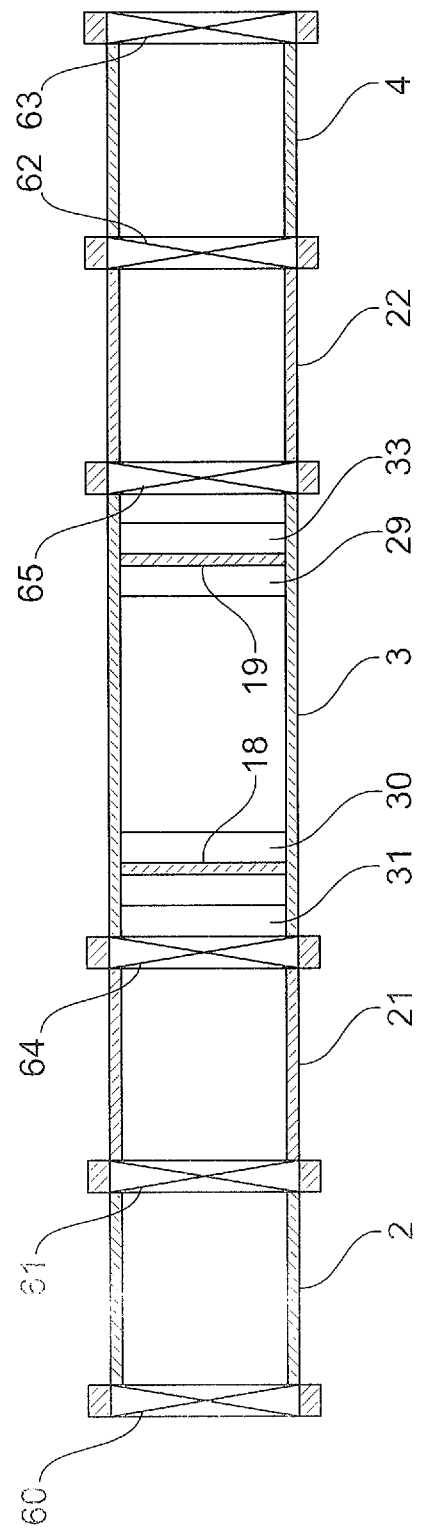
FIG. 1: a section in a top view of a prior art known as a 5-chamber plant

FIG. 1 shows a known 5-chamber coating system with a feed chamber 2, a buffer chamber 21, a process chamber 3 with a transfer chamber 31 which has a slit diaphragm 30 with a slit diaphragm suspension 18 and a transfer chamber 33 with a slit diaphragm 29 and a slit diaphragm suspension 19. The actual process chamber 3 is usually composed of many individual segments of the same size, whereby depending on the requirement, so many segments are connected to one another in such a way that the respective tasks can be carried out therein. To the process chamber 3 is followed by a buffer chamber 22 and to this one discharge chamber 4. In order to introduce the substrates, the feed chamber 2 has a sluice gate 60. Feed chamber 2 and buffer chamber 21 are closed by a sluice gate 61 can be separated from one another by vacuum. The buffer chamber 21 and the process chamber 3 are vacuum-evacuated from each other by a separable sluice gate 64. The process chamber 3 and the buffer chamber 2 can be separated from one another by a sluice gate 65, while the buffer chamber 22 and the discharge chamber 4 can be separated from each other by a sluice gate 62. The discharge chamber 4 finally has a port 63. The chambers 2, 21, 3, 22 and 4 transport equipment for substrates. The chambers 2, 21, 3, 22 and 4 can all be evacuated by pumps.

For the purpose of introducing the substrates, the substrates in the known plant are initially introduced into the feed chamber 2, the pressure being reduced to approximately 15 mbar. Thereafter, the substrates are redirected into the buffer chamber 21, wherein the pressure is further reduced to a level which is close to the pressure in the process chamber 3. Since, in the chambers 2 and 21, the pumping-out can take place in parallel in both chambers, the cycle time can be reduced compared to the operation of a three-chamber system.

In a special operation for long-lasting substrates, the known 5-chamber system is operated as a three-chamber system, with chambers 2 and 21 being flooded. In this case, the gate 60 is opened, with the gate 61 always remaining open. A substrate is then conveyed into the chambers 2 and 21 and the gate 60 is closed again. For processing substrates with over-length, the pump programs the two chambers 2, 21 so that only both chambers 2, 21 are pumped from atmospheric pressure to approximately 0.05 mbar. In the known installation, the pump set of the chamber 2 consists of rotary slide pumps, which can pump down from atmospheric pressure. The pump set of the chamber 21 contains, in addition to rotary slide pumps, root pumps, which can only be connected upwards from approximately 7 mbar. In order to pump off the enlarged feed chamber 2 and 21 to approximately 0.05 mbar, both pump sets are used one after the other and do not operate in parallel as in the 5-chamber standard mode, the cycle time being extended.

Figure 2:
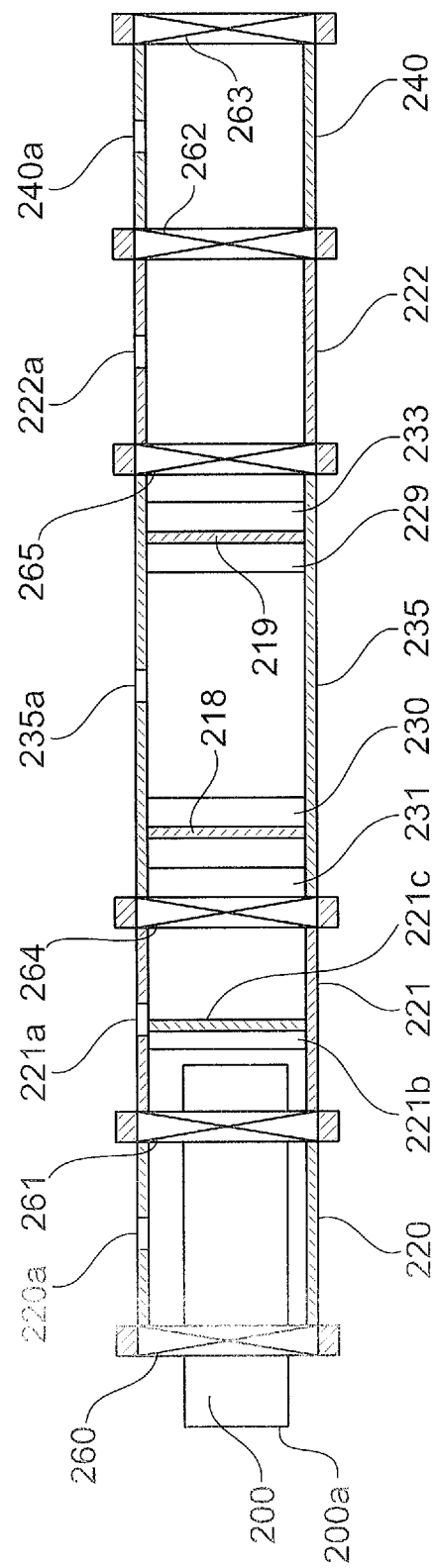
FIG. 2: a section in a top view of an inline-coating plant.

FIG. 2 shows an inline coating installation according to the invention, which comprises a first buffer chamber 221, which is connected to the introduction chamber 220, which can be separated from the introduction chamber 220 by means of a first sluice gate 261, a process chamber 235 which adjoins the buffer chamber 221 and which is fed from the buffer chamber 221 by means of a second sluice gate 264, a second buffer chamber 222, which adjoins the process chamber 235, and which can be opened by means of a third sluice gate 265 from the process chamber 235, a discharge chamber 240, which is connected to the second buffer chamber 222, with an outlet port 263, which can be separated from the second buffer chamber 222 by means of a fourth sluice gate 262, the sluice chamber 220, the buffer chamber 221, the buffer chamber 222, the substrates 200 for the coating are transported from the feed chamber 220 through the buffer chamber 221 to the process chamber 235 and from the process chamber 235 through the buffer chamber 222 to the discharge chamber 240. The transfer chamber 240 is designed as a module for receiving substrates up to a predetermined size. FIG. 2 shows a substrate 200, which is larger than the modules, which projects into the chambers 220 and 221. The method and the system are also suitable for the coating of substrates which are smaller than the modules.

The buffer chamber 221 has a slit slider device with at least one slit diaphragm 221b with an optional slit diaphragm suspension 221c. Preferably, the slit gate means comprises two or more slit diaphragms.

The process chamber 235 can be designed analogously to the process chamber 3 known from the prior art. Advantageously, the process chamber 235 has a transfer chamber 231 with a slit diaphragm 230 with a slit diaphragm suspension 218 as well as a transfer chamber 233 with a slit diaphragm 229 and a slit diaphragm suspension 219.

Pump connections 220a, 221a, 235a, 222a and 240a and associated pumps (not shown in FIG. 2) are provided for evacuating the chambers. Further pump connections are conceivable. Preferably, the pump set of chamber 220 and/or chamber 240 includes rotary slide pumps which are atmospheric pressure which can pump down. The pump set of the chamber 221 and/or of the chamber 222, in addition to preferably rotary slide pumps, preferably also contains root pumps which can evacuate to a lower pressure level.

At least the chamber 220 has ventilation devices (not shown in FIG. 2). In other embodiments chambers 221, 235, 222 and 240 also have ventilation devices.

The chambers 220, 221, 235, 222 and 240 also have transport devices for the substrates and are equipped with control devices, in particular for pump operation, transport of the substrates, opening and closing of the gates as well as carrying out the tasks within the process chamber 235.

According to the invention, even with the first sluice gate 261 open, a pressure gradient is set between the pressure in the region of the second sluice gate 264 and the pressure in the region of the first sluice gate 261.

The pressure gradient has a lower value in the region of the second sluice gate 264 than in the region of the first sluice gate 261. Preferably, a 2-fold lower pressure or lower than in the region of the first sluice gate 261 is set in the region of the second sluice gate 264. It is particularly advantageous if a 10-20, 30-40, 50-, 60-, 70-, 80-, 90-fold lower pressure is applied in the region of the second sluice gate 264 than in the region of the first sluice gate 261, at least at a time when the second gate 264 is opened. It is also conceivable that a 100, 150, 200 or even lower pressure is set in the region of the second sluice gate 264 rather than in the region of the first sluice gate 261.

The pressure gradient is determined dynamically during the course of the process. The pressure gradient of the substrate is lower than at the time of re-entry into the process chamber 235, or the transfer chamber 231.

The values which the pressure gradient assumes depend on the pump performance and the pressure gradient position and the conductance value of the pump connections in the buffer chamber 221. The values which the pressure gradient assumes also depend on the embodiment of the slot sluice device, in particular its length and/or the conductance of the individual gaps or the total conductance of the gaps slot sluice device.

The buffer chamber 221 is advantageously continuously evacuated, particularly with the exception of a time interval in which the inlet chamber 220 is vented and in which the evacuation of the buffer chamber 221 by the pumps is interrupted. Advantageously, the buffer chamber 221 is also evacuated when the insertion gate 260 is open.

The system is preferably operated in a clock cycle where a cycle time is the time required by the introduction of a first substrate into the in chamber 220 until the introduction of a second substrate.

For the coating of substrates with a length less than the length of the chamber modules, the first sluice gate 261 is closed, the insertion gate 260 is opened, a substrate is transported into the insertion chamber 220, and the insertion gate 260 is closed. Then the first sluice gate 261 is opened, the substrate is conveyed into the buffer chamber 221, and a lower pressure is set in the buffer chamber 221 in the area of the sluice gate 264 than in the sluice chamber 220. The first so-called transfer pressure, which is approximately equal to the pressure in the transfer chamber 231 of the transfer chamber 231, is evacuated to a lower pressure process chamber 235. Then, the second gate 264 is opened, the substrate is transported into the process chamber 235, the second gate 264 is closed, and the substrate is processed in the process chamber 235.

The sluice chamber 220 is vented to a pressure which approximately corresponds to the atmospheric pressure, before the re-opening of the insertion gate 260, so that the inlet port 260 is opened when an atmospheric pressure is reached.

After the substrate has been processed in the process chamber 235, the substrate is discharged from the plant via the chambers 222 and 240, it being understood that, similarly to chamber 221, a slit sluice device with a slit diaphragm can also be provided in the chamber 222 (in FIG not shown). It can then at the discharge of substrates in the same way as in the introduction of substrates. When the sluice gate 262 is open, a pressure gradient can be established between the pressure in the region of the sluice gate 265 and the sludge gate 266 by means of the slit sluice device pressure in the region of the sluice gate 262. The pressure gradient has a lower value in the region of the sluice gate 265 than in the region of the sluice gate 262.

Advantageously, the buffer chamber 222 is also evacuated when the discharge port 263 is open.

For the coating of substrates 200, which are larger than the modules, the insertion gate 260 and the first sluice gate 261 are opened. A substrate 200 is inserted into the infeed chamber 220 and the buffer chamber 221. The insertion gate 260 is closed and the introduction chamber 220 is evacuated to a predetermined pressure. The buffer chamber 221 is evacuated in the region of the second sluice gate 264 to a lower pressure, the so-called transfer pressure, which can correspond approximately to the pressure in the transfer chamber 231 or the process chamber 235. Then, the second gate 264 is opened and the substrate 200 is transported into the process chamber 235 to be processed there.

When discharging excessively long substrates 200, it can be moved in the same way as for the introduction of excess substrates 200.

An embodiment of the invention is distinguished by the fact that the first sluice gate 261 is closed after the substrate 200 with its rear edge 200a has passed through the first sluice gate 261 and the rear edge 200a has not passed the second sluice gate 264.

An embodiment of the invention is characterized in that the second sluice gate 264 is closed after the substrate 200 has passed the second sluice gate 264 with its rear edge 200a.

A further embodiment of the invention is characterized in that the first sluice gate 261 is opened after the substrate 200 with its rear edge 200a has passed the second sluice gate 264 and the sluice gate 264 has been closed.

The sluice chamber 220 is opened prior to the re-opening of the insertion gate 260, in particular for the introduction of a new substrate, to a pressure which approximately corresponds to the atmospheric pressure, and the insertion gate 260 is thus reached when a new substrate reaches atmospheric pressure. The venting of the sluice chamber 220 occurs at the earliest when the rear edge 220a of the substrate 220 has been transported through the sluice gate 261 and the sluice gate 261 has been closed. In the event that the sluice gate 261 is still open, the ventilation is not effected until the sluice gate 264 has been closed.

A further embodiment of the invention is distinguished by the fact that a pressure gradient between the pressure in the region of the second sluice gate 264 and the pressure in the region of the second sluice gate 264 is also achieved by the operation of pumps connected to the chamber 221 within the buffer chamber 221 when the insertion gate 260 and the first sluice gate 261 are open and the area of the first sluice gate 261 is maintained. Preferably, provision can be made for a pressure of approximately 400 mbar to 750 mbar to be maintained within the buffer chamber 221 in the region of the second sluice gate 264.

It may also be provided that within the buffer chamber 221a pressure gradient is established between the pressure in the region of the second sluice gate 264 and the pressure in the region of the first sluice gate 261 in which the pressure in the region of the second sluice gate 264 is at least 2 times smaller than pressure in the region of the first sluice gate 261.

LIST OF REFERENCES 2 feed chamber
3 process chamber
4 discharge chamber 18 slit diaphragm suspension
19 slit diaphragm suspension
21 buffer chamber
22 buffer chamber
29 slit diaphragm
30 slit diaphragm
31 transfer chamber
33 transfer chamber
60 sluice gate
61 sluice gate
62 sluice gate
63 sluice gate
64 sluice gate
65 sluice gate
200 substrate
218 slit diaphragm suspension
219 slit diaphragm suspension
220 introduction chamber
220a pump connection
221 buffer chamber
221a pump connection
221b slit diaphragm
221c slit diaphragm suspension
222 buffer chamber
222a pump connection
229 slit diaphragm
230 slit diaphragm
231 transfer chamber
233 transfer chamber
235 process chamber
240 discharge chamber
240a pump connection
260 insertion gate
261 insertion gate
262 insertion gate
263 insertion gate
264 insertion gate
265 insertion gate

The invention claimed is:

1. A method for operating an inline coating installation, the inline coating installation comprising:
   an introduction chamber with a first insertion gate,
   a first buffer chamber adjoining the introduction chamber which can be separated from the introduction chamber by means of the first insertion gate,
   a process chamber adjoining the first buffer chamber which can be separated from the first buffer chamber by means of a second insertion gate,
   a second buffer chamber adjoining the process chamber which can be separated from the process chamber by means of a third insertion gate,
   a discharge chamber adjoining the second buffer chamber having an outlet port, which can be separated from the second buffer chamber by means of a fourth insertion gate, wherein the introduction chamber, the first buffer chamber, the second buffer chamber, and the discharge chamber are designed for receiving of substrates of a predetermined size, and
   the method comprising transporting substrates for coating from the introduction chamber through the first buffer chamber to the process chamber and from the process chamber through the second buffer chamber to the discharge chamber,
   characterized in that:
   the first buffer chamber has a gap sluice device with at least one slit diaphragm, and by means of the gap sluice device, when the first insertion gate is opened or closed, a pressure gradient within the first buffer chamber is adjusted between the pressure in the region of the second insertion gate and the pressure in the region of the first insertion gate.

2. The method according to claim 1, characterized in that for the coating of substrates, which are smaller than the predetermined size, the method comprises:
   closing the first insertion;
   opening the second insertion gate;
   transporting a substrate into the introduction chamber;
   the insertion gate is closed;
   the coating chamber is evacuated to a predetermined pressure;
   opening the first insertion gate;
   conveying the substrate into the buffer chamber, wherein in the buffer chamber, in the region of the insertion gate, a lower pressure is defined as being arranged in the introduction chamber;
   closing the first insertion gate;
   evacuating the buffer chamber to a transfer pressure, and opening the second insertion gate;
   transporting the substrate into the process chamber; and
   closing the second insertion gate and processing the substrate in the process chamber.

3. The method according to claim 1, characterized in that for the coating of substrates, which are larger than the predetermined size, the method comprises:
   opening the first insertion gate and the second insertion gate;
   transporting a substrate into the introduction chamber and the buffer chamber, wherein a lower pressure is set in the buffer chamber in the region of the insertion gate than in the introduction chamber;
   closing the insertion gate;
   evacuating the introduction chamber to a predetermined pressure;
   evacuating the buffer chamber to a transfer pressure in the region of the second insertion gate; and
   opening the second insertion gate and transporting the substrate into the processing chamber to be processed there.

4. The method according to claim 3, characterized in that the first insertion gate is closed after the substrate has passed the first insertion gate with its rear edge, and the rear edge has not yet passed the second insertion gate.

5. The method according to claim 4, characterized in that the second insertion gate is closed after the substrate has passed the second insertion gate with its rear edge.

6. The method according to claim 5, characterized in that the first insertion gate is opened after the substrate has passed the second insertion gate with its rear edge.

7. The method according to claim 1, characterized in that a pressure below the atmospheric pressure is set within the buffer chamber in the region of the second insertion gate when the insertion gate and the first insertion gate are opened.

8. The method according to claim 1, characterized in that a continuous evacuation of the buffer chamber takes place by means of pumps connected to the buffer chamber.

9. The method according to claim 1, characterized in that within the buffer chamber a pressure gradient is established between the pressure in the region of the second insertion gate and the pressure in the region of the first insertion gate in the region of the second insertion gate is at least 2 times smaller than pressure in the region of the first insertion gate.

* * * * *